United States Patent
Lyakh et al.

(10) Patent No.: US 8,121,164 B1
(45) Date of Patent: Feb. 21, 2012

(54) QUANTUM CASCADE LASER: BIAS-NEUTRAL DESIGN

(75) Inventors: Arkadiy Lyakh, Marina del Rey, CA (US); Richard Maulini, Los Angeles, CA (US); Alexei Tsekoun, Los Angeles, CA (US); C. Kumar N. Patel, Los Angeles, CA (US)

(73) Assignee: Pranalytica, Inc., Santa Monica, CA (US)

(*) Notice: Subject to any disclaimer, the term of this patent is extended or adjusted under 35 U.S.C. 154(b) by 0 days.

(21) Appl. No.: 12/976,856

(22) Filed: Dec. 22, 2010

Related U.S. Application Data

(60) Provisional application No. 61/284,603, filed on Dec. 22, 2009.

(51) Int. Cl.
  *H01S 5/00* (2006.01)
(52) U.S. Cl. .................... 372/44.01; 372/45.01
(58) Field of Classification Search ............... 372/44.01, 372/45.01, 45.011, 45.012
  See application file for complete search history.

(56) References Cited

U.S. PATENT DOCUMENTS

| | | | |
|---|---|---|---|
| 5,457,709 A | 10/1995 | Capasso et al. | |
| 6,751,244 B2 | 6/2004 | Faist et al. | |
| 6,922,427 B2 | 7/2005 | Faist et al. | |
| 2008/0159341 A1 | 7/2008 | Patel et al. | |
| 2009/0213890 A1 | 8/2009 | Patel et al. | |
| 2011/0080930 A1* | 4/2011 | Liu et al. ............ | 372/45.012 |

OTHER PUBLICATIONS

J. Faist, D. Hofstetter, M. Beck, T. Aellen, M. Rochat and S. Blaser, 'Bound-to-Continuum and Two-Phonon Resonance Quantum-Cascade Lasers for High Duty Cycle, High-Temperature Operation', IEEE Journal of Quantum Electronics 38, 533 (2002).
K. Fujita, S. Furuta, A. Sugiyama, T. Ochiai, T. Edamura, N. Akikusa, M. Yamanishi, and H. Kan, "Room Temperature, Continous-Wave Operation of Quantum Cascade Lasers With Single Phonon Resonance-Continuum Depopulation structures Grown by Metal Organic Vapor-Phase Epitaxy", Applied Physics Letters 91, 141121 (2007).
A. Wittmann, Y. Bonetti, J. Faist, E. Gini, and M. Giovannini, Appl. Phys. Lett. 93, 141103 (2008).

* cited by examiner

Primary Examiner — Armando Rodriguez
(74) Attorney, Agent, or Firm — Cislo & Thomas, LLP

(57) ABSTRACT

A quantum cascade laser (QCL) having a bias-neutral design and a semiconductor with multiple layers of $Al_xIn_{1-x}As/In_yGa_{1-y}As$. The first active region barrier has a thickness of less than fourteen angstroms, and the second active region barrier has a thickness of less than eleven angstroms. The lower active region wavefunction overlaps with each of the injector level wavefunctions. Also, the laser transition is vertical at a bias close to roll-over. The injector level 3' is above a lower laser level 3, the injector level 2' is below the lower laser level 3, and the active region level 2 is confined to the active region. The lower laser level 3 is separated from the active region level 2 by the energy of the LO phonon. The remaining active region states and the remaining injector states are either above the lower laser level 3 or significantly below the active region level 2.

6 Claims, 13 Drawing Sheets

FIG. 11

| STRUCTURE | COMPOSITION | $E_c$ (meV) | FIRST BARRIER THICKNESS (Å) | SECOND BARRIER THICKNESS (Å) | EXPERIMENTAL EL FWHM (meV) |
|---|---|---|---|---|---|
| 1 | $Al_{0.64}In_{0.36}As/In_{0.67}Ga_{0.33}As$ | 750 | 14 | 11 | 26.4 |
| 2 | $Al_{0.78}In_{0.22}As/In_{0.72}Ga_{0.28}As$ | 920 | 11 | 8 | 22.0 |
| 3 | $Al_{0.85}In_{0.15}As/In_{0.75}Ga_{0.25}As$ | 1050 | 11 | 6 | 20.0 |

QUANTUM CASCADE LASER: BIAS-NEUTRAL DESIGN

CROSS-REFERENCES TO RELATED APPLICATIONS

This patent application claims the benefit of U.S. Provisional Patent Application Ser. No. 61/284,603 filed Dec. 22, 2009 for Quantum Cascade Laser: Bias-Neutral Design, and that application is incorporated here by this reference.

TECHNICAL FIELD

This invention relates to quantum cascade lasers.

BACKGROUND ART

A quantum cascade laser (QCL) is a multilayer semiconductor laser, based only on one type of carrier (usually electrons). A schematic diagram of a QCL is shown in FIG. 1. It consists of multiple layers of $Al_xIn_{1-x}As/In_yGa_{1-y}As$ having different compositions x and y, typically grown using molecular beam epitaxy (MBE) or metal organic chemical vapor deposition (MOCVD) techniques. Electric current in these devices is injected along the x-axis, perpendicular to the grown layers. An insulator confines the current under the contact stripe, preventing it from spreading in the y-direction. When carriers reach the gain section, they emit photons through intersubband radiative transitions (see below). Waveguide and cladding layers confine emitted light around the gain region and direct it along the z-axis. A laser of this type is described in U.S. Pat. No. 5,457,709.

The gain section of a QCL usually consists of 20 to 60 identical gain stages. A gain stage consists of approximately 20 very thin $In_xGa_{1-x}As$ and $Al_yIn_{1-y}As$ layers (1-5 nm) with alternating bandgap material compositions (quantum wells and barriers). A schematic of the conduction band diagram of one gain stage under applied electric field is shown in FIG. 2. In an ideal case each carrier emits one photon in each gain stage.

As claimed in U.S. Pat. No. 5,457,709, the layers within the stage are usually divided into two regions: the active region and the energy relaxation region (injector). The active region is designed for light emission through carrier radiative intersubband transitions (transition from level 3 to level 2 in FIG. 2), while the energy relaxation region (injector) is used for energy relaxation of carriers before injection into the next stage.

Carrier population inversion between the upper and lower laser levels (levels 3 and 2 in FIG. 2), required for lasing, can be achieved when the upper laser level lifetime, $\tau 3$, is longer than the lower laser level lifetime, $\tau 2$. As claimed in U.S. Pat. No. 5,457,709, this condition is met when the energy spacing between levels 2 and 1, $E_{21}$, is designed to be substantially equal to the energy of the longitudinal optical (LO) phonon (~35 meV in case of InP-based QCLs). In this case $\tau 2$ and lower laser level population are substantially reduced. This scheme is often called the single-phonon design.

QCL performance can be substantially improved employing a so-called two-phonon resonance design (see U.S. Pat. No. 6,751,244) instead of the single-phonon resonance design described above. A schematic conduction band diagram for this design is shown in FIG. 3. The active region in this case is composed of at least four quantum well/barrier pairs instead of at least three for the single-phonon design. The lasing transition occurs between energy levels 4 and 3. Significantly, energy spacings $E_{32}$ and $E_{21}$ are both substantially equal to LO phonon energy, leading to short $\tau 3$ and $\tau 2$. Since the energy spacing between the lower laser level and the lowest active region level $E_{31}$ (~70 meV) is increased by a factor of two compared to $E_{21}$ in case of the single-phonon resonance design (~35 meV), the two-phonon resonance design has an advantage of reduced carrier population on the lower laser level 3 due to reduced carrier thermal backfilling for this state from the lowest active region state 1.

The last active region barrier (the so-called extraction barrier), in FIG. 3 that illustrates the two-phonon design, is usually thicker than the other active region barriers (except the first active region barrier, called the injection barrier). This helps to confine the lower laser level within the active region, increasing its overlap with the upper laser level and, as a consequence, increasing the laser transition matrix element. However, a thicker extraction barrier leads to longer electron extraction time from the active region to the injector, as discussed in Reference 1 (citation provided below). Longer extraction time increases global transit time of an electron across an active region stage, leading, in turn, to lower maximum current density for the same doping level. See Reference 2 (citation provided below) and references therein for details.

In the Bound-to-Continuum design, described in U.S. Pat. No. 6,922,427, the laser transition occurs between the upper laser level and delocalized lower laser levels, as shown in FIG. 4. Since the lower laser levels are delocalized, there is no electron extraction bottleneck that slows electron transport in the two-phonon case. However, since the laser transition is diagonal, the corresponding matrix element is lower and linewidth is larger. Both lower laser transition matrix element and larger linewidth reduce the active region differential gain, lowering laser performance.

The Single Phonon Resonance-Continuum Depopulation design, presented in Reference 3 (citation provided below), combines vertical laser transition, characteristic to the two-phonon design, and delocalized carrier extraction, characteristic to the bound-to-continuum design. However, this combination is realized only at bias close to roll-over, when the lowest injector state in the previous stage and the upper laser level are close to resonance. Indeed, according to the band diagram presented in Reference 3, calculated approximately at roll-over bias, there is an injector level located just below the lower laser level. Therefore, at slightly lower bias, these levels align with each other due to the Stark effect. Since there is a strong active region/injector coupling, these levels become delocalized at lower bias. As follows from typical QCL voltage vs. current (IV) characteristics, current starts flowing through a superlattice at bias significantly below its roll-over value. Therefore, delocalization of the lower laser level leads to an increase in threshold current density, reducing laser dynamic range, maximum optical power and wall plug efficiency.

The goal of the present invention is to achieve vertical transition and fast carrier extraction in a broad bias range, i.e. to introduce a bias independent design method. Stability of QCL parameters at lower bias has been consistently overlooked in QCL design so far.

DISCLOSURE OF INVENTION

This document discloses a quantum cascade laser having a bias-neutral design. In one aspect, the invention is a quantum cascade laser having a semiconductor with only one type of carrier. The semiconductor has multiple layers of $Al_xIn_{1-x}As/In_yGa_{1-y}As$, where x is a number between (but not including) 0 and 1, and y is a number between (but not including) 0 and 1. An electric current is injected along an x-axis perpendicular to the multiple layers. And an insulator confines the electric current under a contact stripe and prevents the electric current from spreading in a y-axis parallel to the multiple layers.

The quantum cascade laser also has a first active region barrier with a thickness of less than fourteen angstroms. It has a second active region barrier with a thickness of less than eleven angstroms.

In addition, the quantum cascade laser has a bias independent design with strong active region/injector coupling. The bias independent design is characterized by several features noted here, including an active region and multiple injector states. The active region includes lower active region states each having a lower active region state wavefunction. And each of the multiple injector states has an injector level wavefunction. At least one of the lower active region wavefunctions overlaps with at least one of the injector level wavefunctions.

Also, the bias independent design has a laser transition that is vertical at a bias close to roll-over. Additionally, the injector level 3' is above a lower laser level 3, the injector level 2' is below the lower laser level 3, and the active region level 2 is confined to the active region. The lower laser level 3 is separated from the active region level 2 by the energy of the longitudinal optical (LO) phonon. The remaining active region states (that is, other than active region level 2) and the remaining injector states (that is, other than injector level 2' and injector level 3') are located either above the lower laser level 3 or significantly below the active region level 2.

Consequently, the lower laser level 3 is well-confined in the active region in a broad bias range and the laser transition from laser level 4 to the lower laser level 3 is vertical.

In another aspect of the invention, the multiple layers are of $Al_{0.78}In_{0.22}As/In_{0.72}Ga_{0.28}As$. The semiconductor has a strain of $-2.0\%$ in the $Al_{0.78}In_{0.22}As$ layers and a strain of $1.3\%$ in the $In_{0.72}Ga_{0.28}As$ layers. In addition, the thickness of the first active region barrier is eleven angstroms (11 A), and the thickness of the second active region barrier is eight angstroms (8 A).

In another aspect of the invention, the multiple layers are of $Al_{0.85}In_{0.15}As/In_{0.75}Ga_{0.25}As$. The semiconductor has a strain of $-2.5\%$ in the $Al_{0.85}In_{0.15}As$ layers and a strain of $1.5\%$ in the $In_{0.75}Ga_{0.25}As$ layers. Additionally, the thickness of the first active region barrier is eleven angstroms (11 A), and the thickness of the second active region barrier is six angstroms (6 A).

BRIEF DESCRIPTION OF DRAWINGS

FIG. 11 is a table showing a summary of experimental study on EL FWHM dependence on thickness of the first and second active region barriers in high strain QCL structures.

BEST MODE FOR CARRYING OUT THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

Figure 1:
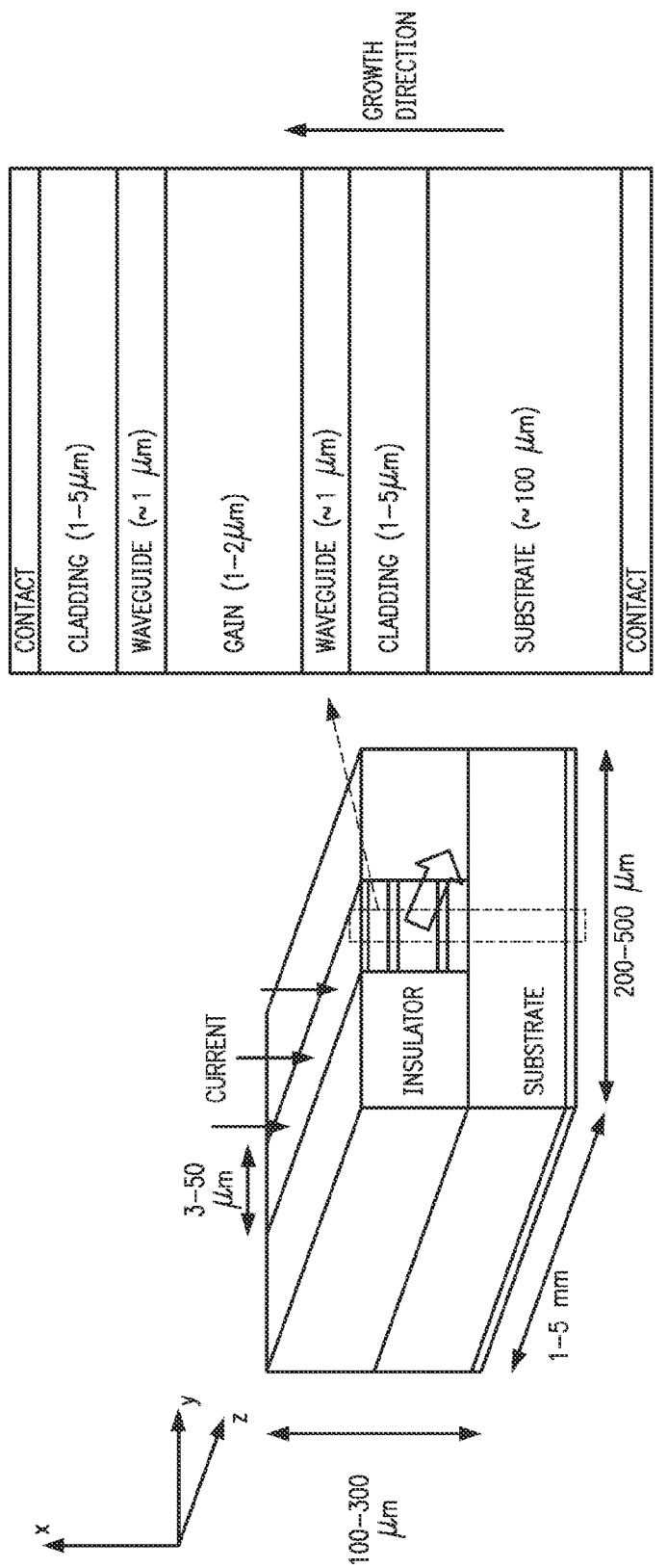
FIG. 1 is a schematic of a buried heterostructure QCL, which is known in the art.
Figure 2:
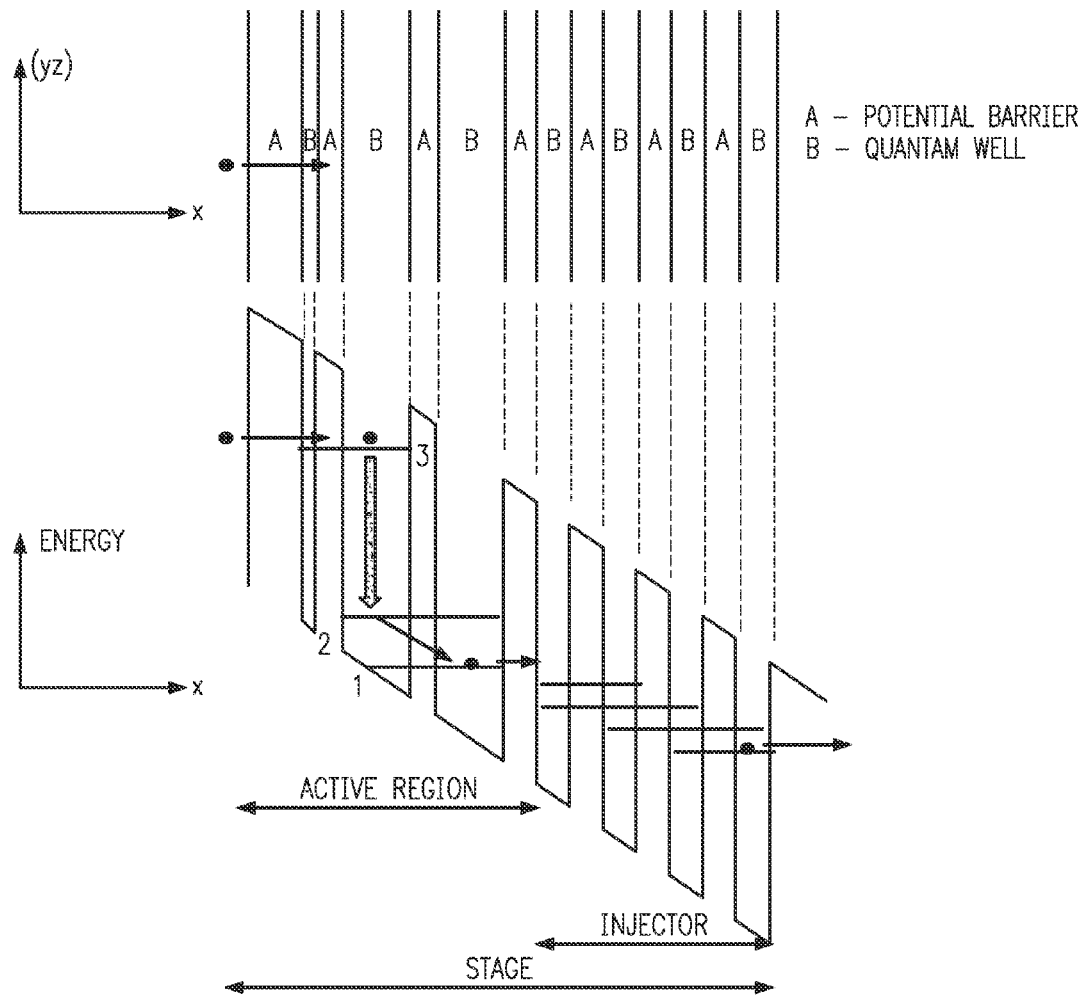
FIG. 2 is a schematic single-stage conduction band diagram of the single-phonon resonance design, which is known in the art.
Figure 3:
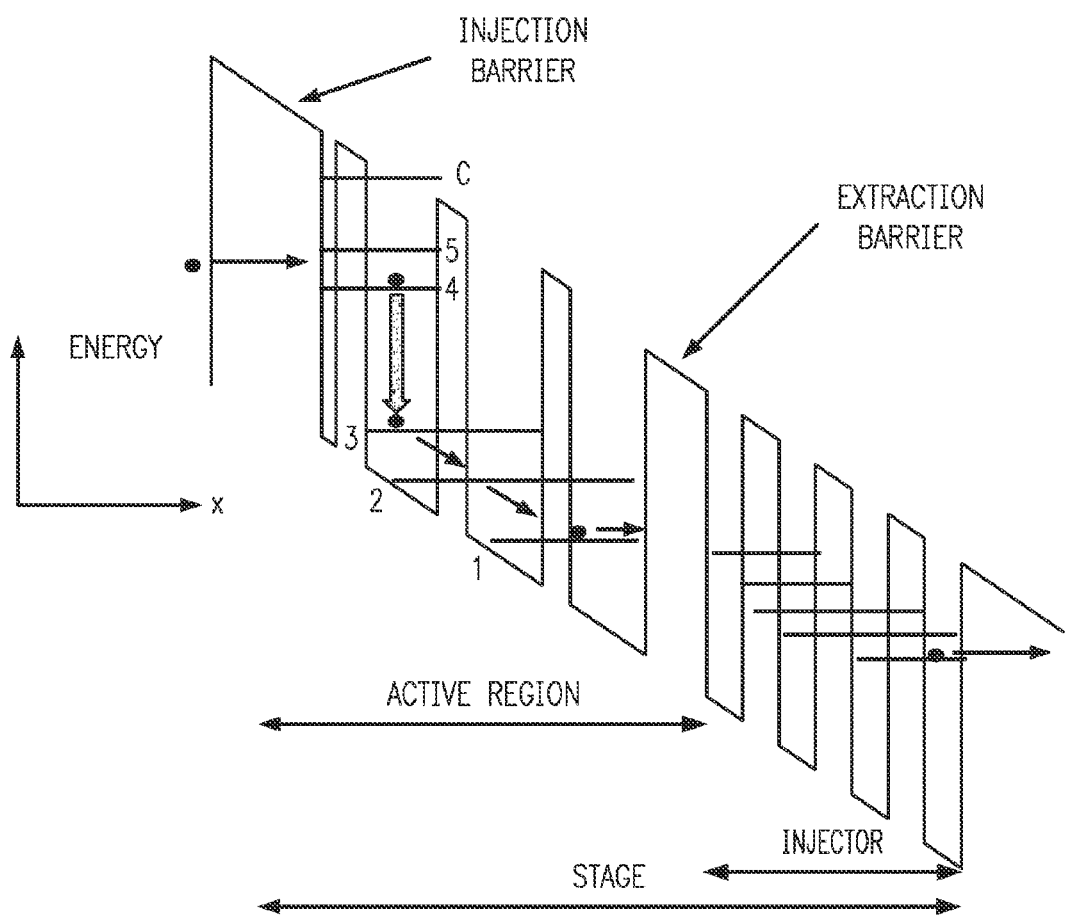
FIG. 3 is a schematic single-stage conduction band diagram for the two-phonon design, which is known in the art.
Figure 4:
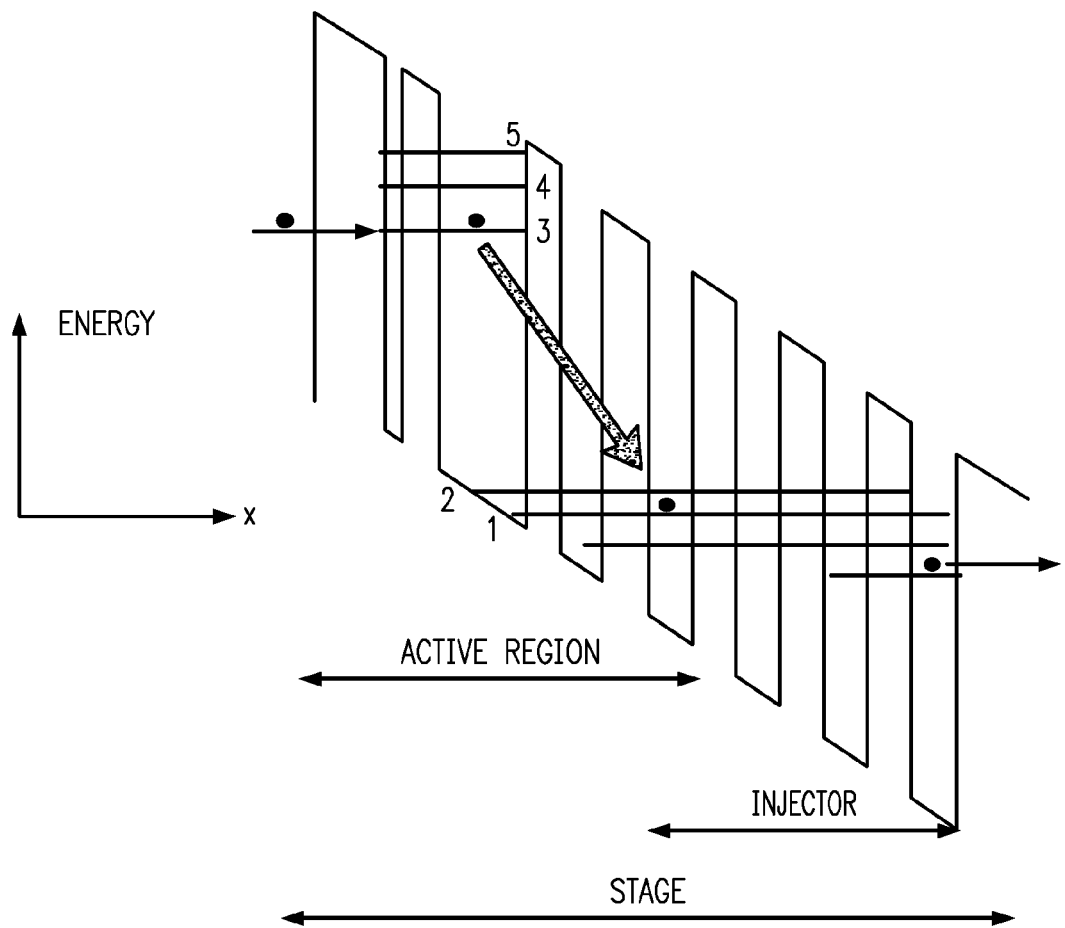
FIG. 4 is a schematic single-stage conduction band diagram for the bound-to-continuum design, which is known in the art.
Figure 5A:
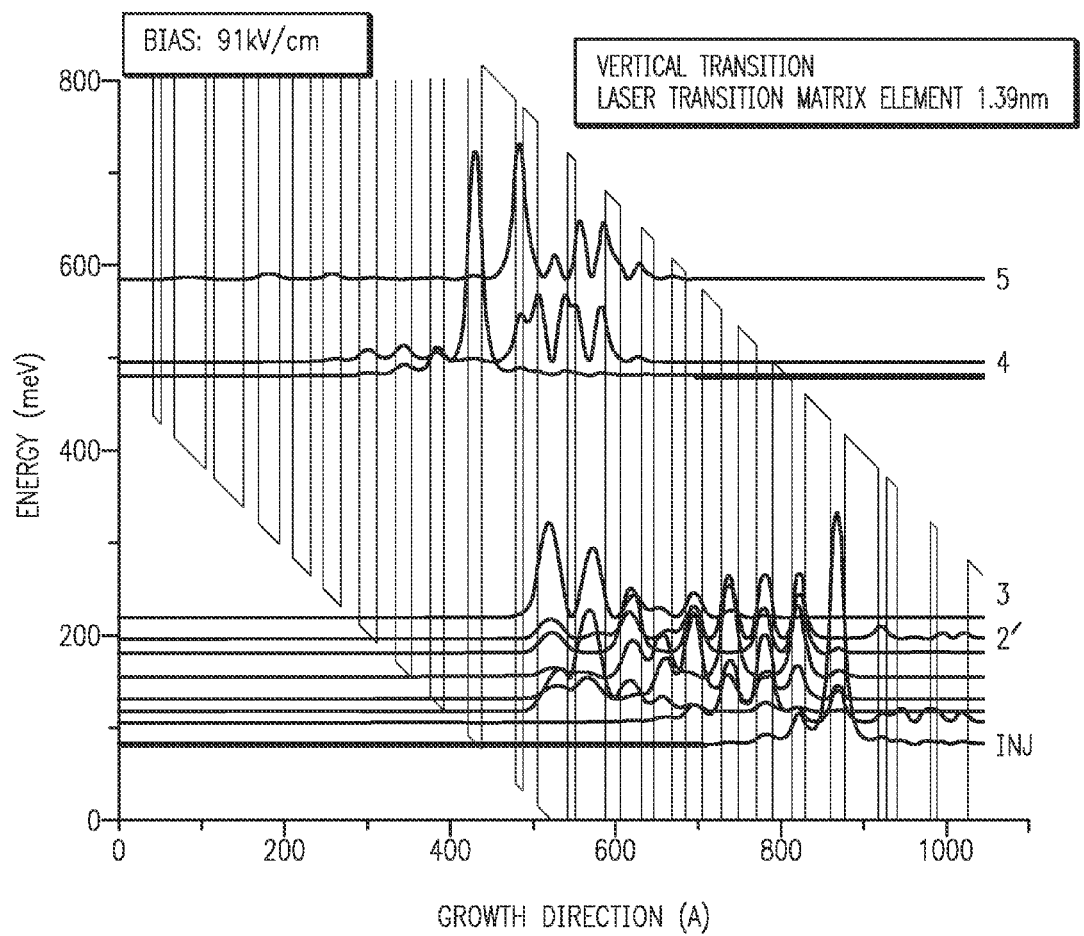
FIG. 5A is a conduction band diagram of a bias dependent design at roll-over, which is known in the art. Injector level 2' is close to the lower laser level 3, which leads to lower laser level delocalization at lower bias as shown in FIG. 5B.
Figure 5B:
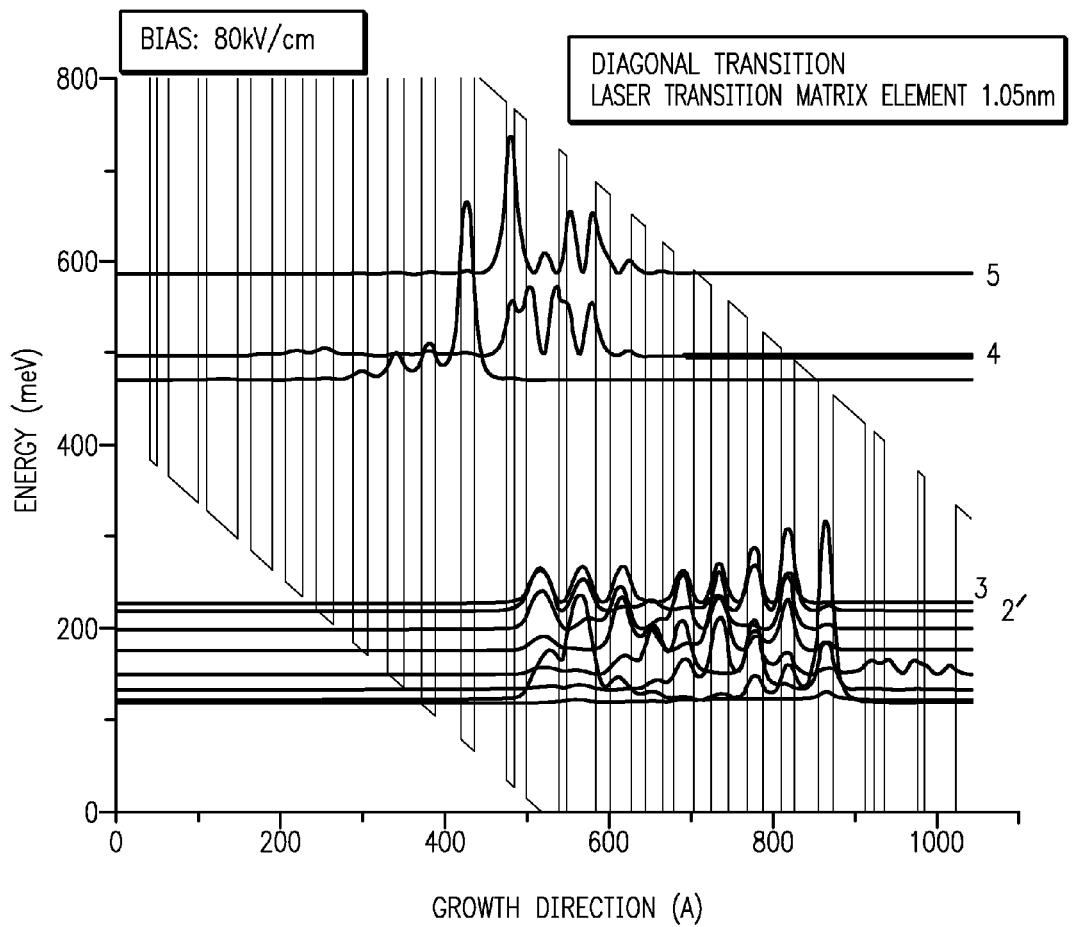
FIG. 5B is a conduction band diagram of the bias dependent design shown in FIG. 5A at voltage below roll-over. The lower laser level is delocalized due to anticrossing with the injector level 2'.

A design generally becomes unstable when there is a strong active region/injector coupling and when there are injector (or active region) states close, in energy space, to the lower laser level. This leads to lower laser level delocalization due to its anticrossing with these states. Conduction band diagrams for an unstable design, presented in FIGS. 5A and 5B, illustrate this problem. The laser transition is designed to be vertical at bias close to resonance between the lowest injector state in the previous stage and the upper laser level 4 (91 kV/cm), as shown in FIG. 5A. At lower bias of 80 kV/cm, the level 2' approximately aligns with the lower laser level. As a consequence, the lower laser level wavefunction is delocalized at this bias, spanning from the active region into the injector. Therefore, the laser transition matrix element reduces from 1.39 nm down to 1.05 nm when bias changes from 91 kV/cm to 80 kV/cm, increasing laser threshold.

Design stability can be improved by reducing active region/injector coupling using a thicker extraction barrier. However, as discussed above, a thicker extraction barrier leads to a longer electron extraction time from the active region to the injector and therefore to a lower maximum current density for the same doping level.

Here we disclose a method to achieve design stability while simultaneously increasing active region/injector coupling. In particular, we found that instead of increasing extraction barrier thickness, stability can be achieved by designing all the injector states to be higher or significantly lower than the lower laser level. As a consequence, despite increased active region/injector coupling, the lower laser level is well confined in the active region in a broad bias range since all the injector states are significantly away from resonance with this level.

Figure 6A:
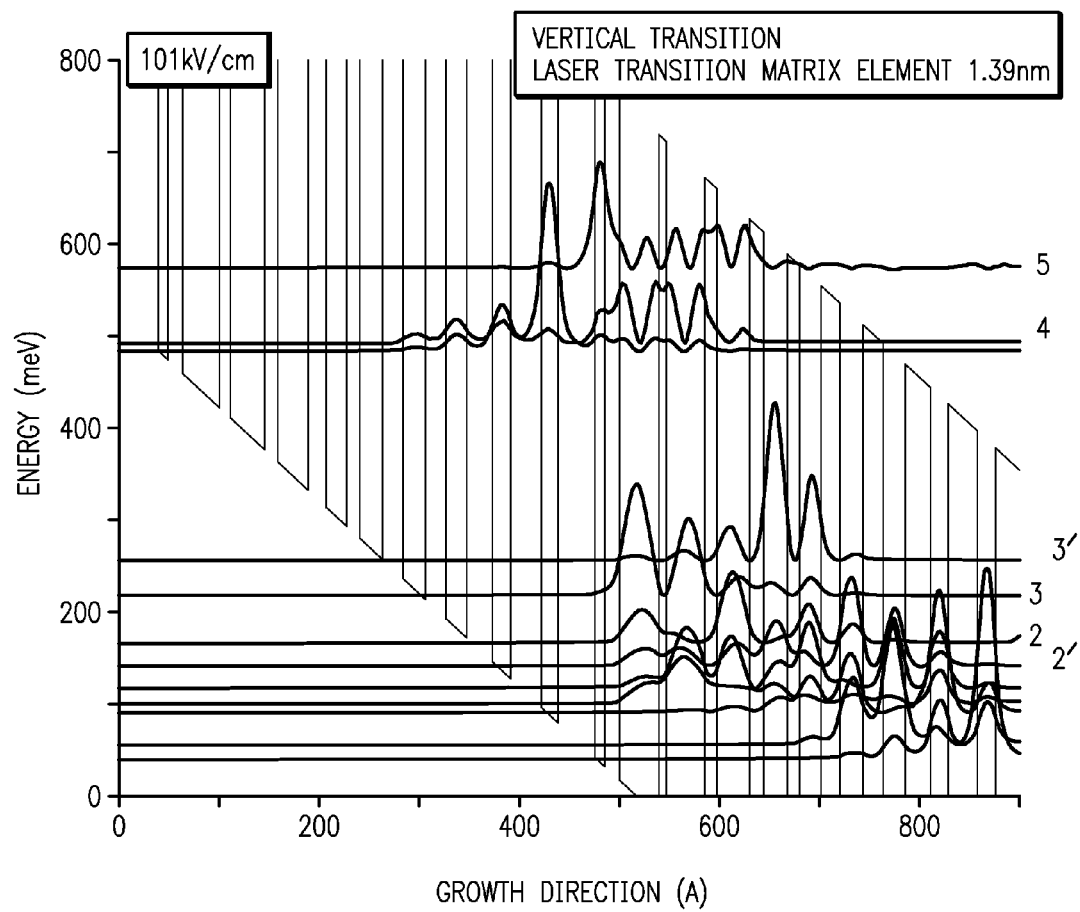
FIG. 6A is a conduction band diagram of a bias independent design at roll-over. Injector level 3' was pushed above the lower laser level and 2' significantly below the lower laser level to achieve design stability in a broad bias range. The active region and injector states significantly overlap indicating a strong active region/injector coupling.
Figure 6B:
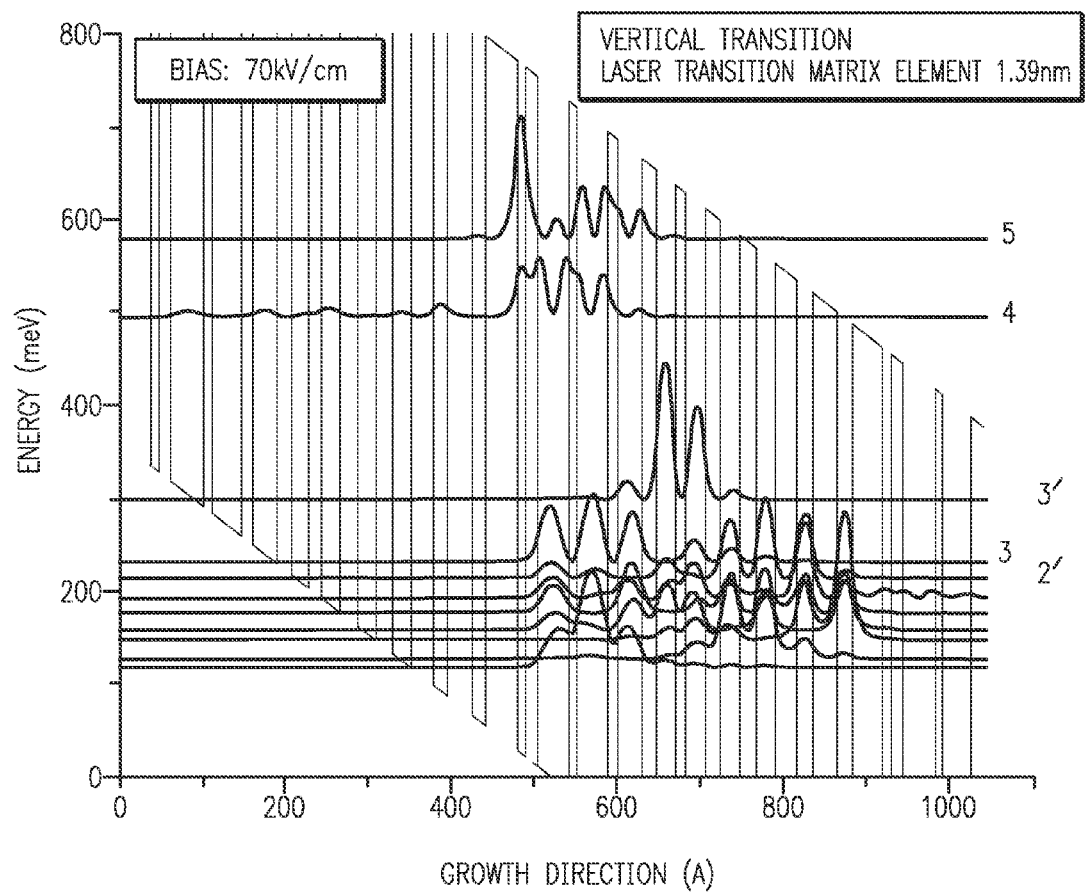
FIG. 6B is a conduction band diagram of the bias independent design shown in FIG. 6A at bias significantly below roll-over. Injector level 3' is above the lower laser level and 2' is still below the lower laser level. As a consequence, the lower laser level is well confined in the active region. The active region and injector states significantly overlap indicating a strong active region/injector coupling.

FIGS. 6A and 6B show an embodiment of this design method. Similar to the structure presented in FIGS. 5A and 5B, the laser transition is designed to be vertical at bias close to roll-over (FIG. 6A). Also, there is a significant overlap between the active region and injector states indicating a strong active region/injector coupling. In general, the coupling is strong when the thickness of the extraction barrier is substantially equal to the thickness of the other injector barriers. To improve design stability, the injector state 3' was designed to be above the lower laser level 3. When bias reduces, the level 3' moves higher relative to the lower laser level 3 due to the Stark effect. As a consequence, anticrossing is not possible between these states in the whole bias range up to roll-over. The injector level 2' is designed to be deep inside the injector at roll-over, significantly below the lower laser level 3. Therefore, even though the energy spacing between these levels reduces when bias reduces, the level 2' is below the lower laser level 3 in a broad bias range. Note, that the active region level 2 is also well confined in the active region. This is in contrast with the approach used in Reference 3 (citation provided below), where this level was essentially replaced by a miniband.

FIG. 6B shows that at 70 kV/cm, significantly below roll-over, the lower laser level is still well confined in the active region. This is a direct consequence of the fact that in this broad bias range the lower laser level does not come into resonance with any of the injector states. As a consequence, the laser transition matrix element is the same for both biases. On the other hand, since the lower active region and injector states are close to each other and there is a strong active region/injector coupling, the lower active region wavefunctions and injector levels wavefunctions overlap with each other. This large overlap leads to a small carrier extraction time from the active region to injector compared to the two-phonon case or any other designs where a thick extraction barrier is used for confinement of the active region levels.

The structure presented in FIGS. 6A and 6B serves as an example of how bias independent structure with a strong active region/injector coupling can be designed. There are other alternative approaches. However, the fundamental idea behind them is that the lower laser level should not come into resonance with any injector levels, or other active region levels, in a broad bias range. We have found that design stability can be achieved when close to roll-over condition if the lower laser level 3 and the active region level 2, located just below level 3, are separated by approximately the energy of the LO phonon, while the rest of the active region and injector states are located either above the low laser level 3 or significantly below the level 2. This ensures that the lower laser level is well confined in the active region in a broad bias range and that the laser transition is vertical from level 4 to level 3. This is the case for design in FIGS. 6A and 6B. In addition, carrier extraction time from the active region to injector is reduced since the active region and injector states located below the active region level 2 overlap with each other (these levels are close to each other in energy space, i.e. close to anticrossing, and the extraction barrier is thin, leading to large active region injector coupling). Simultaneous realization of vertical laser transition and fast carrier extraction from the active region to injector in a broad bias range leads to lower laser threshold current density and increased dynamic range. This translates to higher optical power and wall plug efficiency for lasers based on bias independent design principles.

Figure 7:
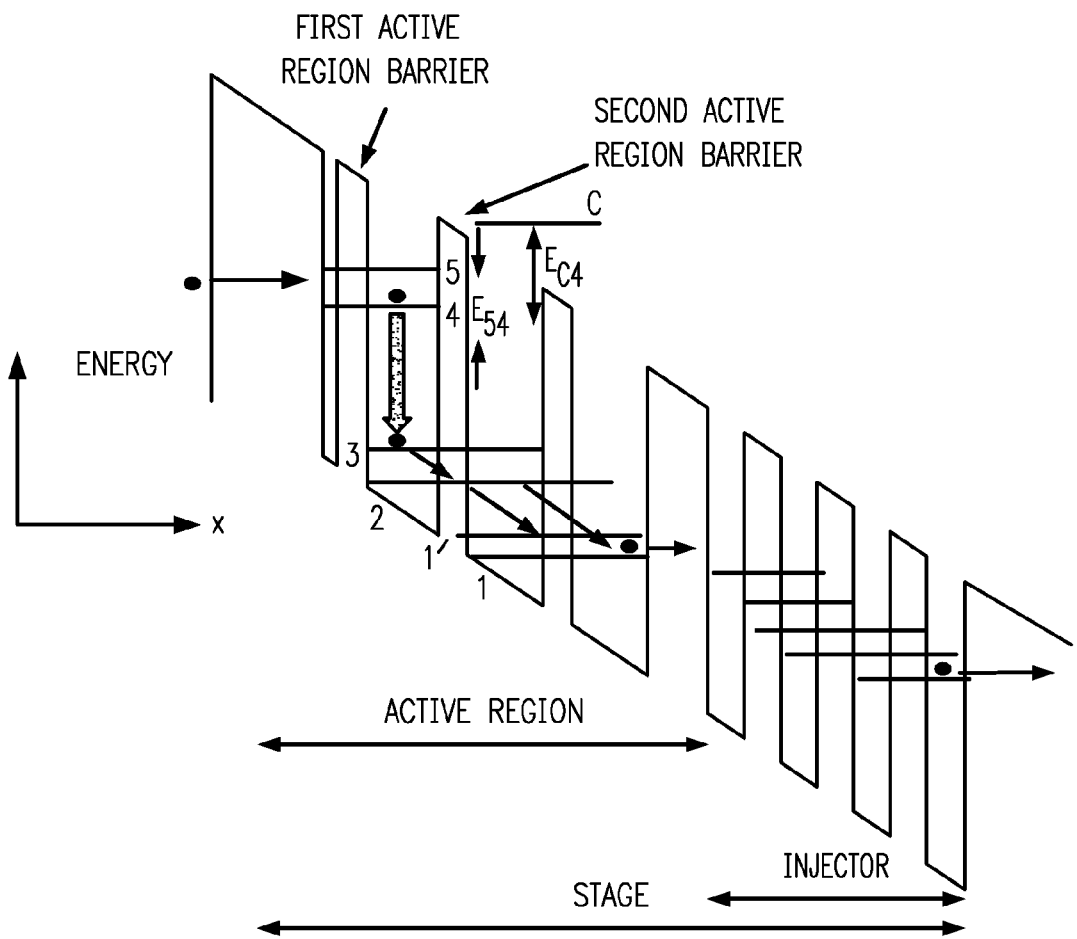
FIG. 7 is a schematic single-stage conduction band diagram of a quantum cascade laser defining the first and the second active region barriers.

Design stability can be further improved by reducing the thickness of the first and second active region barriers (FIG. 7) relative to the extraction barrier and the injector barriers, while keeping the active region and injector quantum wells thicknesses approximately the same. In this case, average lower laser level wavefunction tends to shift towards the first large active region quantum well that is located between the first and the second active region barriers. This leads to more vertical laser transition and better design stability.

However, for the same material composition, i.e. for the same potential barrier height, employment of thin first and second active region barriers reduces laser transition energy. For short wavelength QCLs (i.e. the wavelength is less than 5 μm), thin means the first and second active region barriers are less than eleven Angstroms. The reduction in transition energy can be compensated using higher strain material with larger potential barrier height that in turn increases laser transition energy. In addition to improved design stability, employment of high barriers with thin first and second active region barriers also suppresses carrier leakage from the upper laser level. Thermal carrier leakage from the upper laser level 4 to continuum states located above the barriers (designated as 'C' in FIG. 7) reduces laser population inversion at a given pumping current density and therefore increases laser threshold current density. Another carrier leakage path is due to carrier excitation to level 5, located in the active region right above level 4, and subsequent scattering to states other than level 4. Employment of higher potential barrier increases energy spacings $E_{C4}$ and $E_{54}$ and therefore suppresses thermal carrier leakage to these states. ($E_{C4}$ and $E_{54}$ are defined in FIG. 7.)

It is generally considered that an increase in barrier height also increases linewidth $\gamma_{43}$ of the laser transition. As described in Reference 4 (citation provided below), the proportionality of the linewidth $\gamma_{43}$ is given by:

$$\gamma_{43} \sim E_C^2 \cdot \Delta^2 \cdot \Lambda^2 \cdot \Sigma(\Psi_4^2(z_k) - \Psi_3^2(z_k))^2 \quad \text{(Formula 1)}$$

where $E_C$ is conduction band offset (barrier height), $\Delta$ is interface roughness length, $\Lambda$ is roughness correlation length, $\Psi$ is electron wavefunction, $z_k$ is interface location, and summation is done over all interface k where either the upper or lower laser level wavefunction is non-zero. Laser threshold current density is inversely proportional to linewidth. Therefore, increase in linewidth for a composition with higher barriers can offset laser performance improvements due to suppressed carrier leakage from the upper laser level and better design stability.

Figure 8:
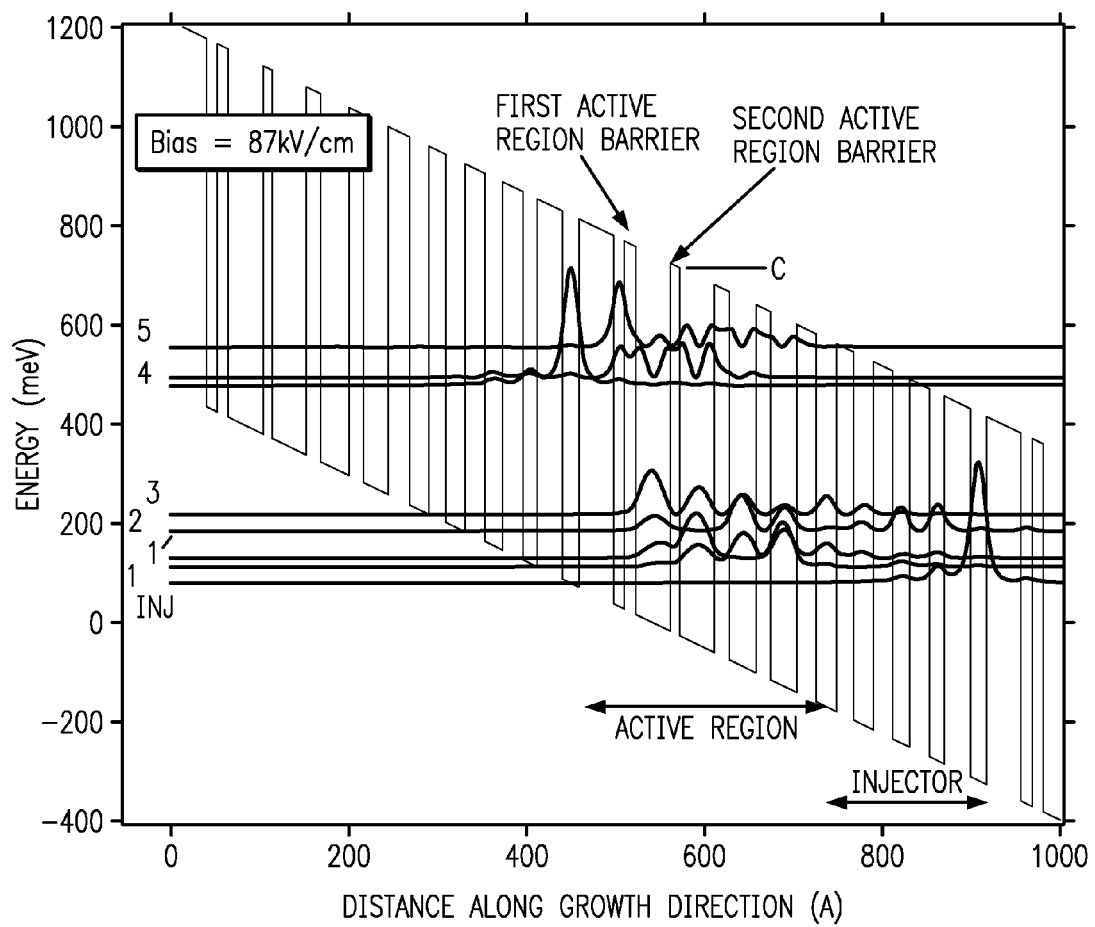
FIG. 8 is a schematic single-stage QCL conduction band diagram of a non-resonant extraction structure.

Formula 1 shows that interfaces where one of the squared laser levels wavefunctions reaches maximum and the other one minimum have the largest contributions to linewidth broadening. First, this means that to minimize linewidth the laser transition should be vertical in space, i.e. the upper and lower laser levels wavefunctions should be both tightly bound in the active region. FIG. 8 shows a conduction band diagram of an exemplary QCL structure with a vertical laser transition. This structure is based on the Non Resonant Extraction (NRE) design approach claimed in U.S. Patent Application Publication 2009/0213890. At the interfaces of the first and the second active region barriers the upper laser level squared wavefunction in FIG. 8 reaches maximum and the lower laser level squared wavefunction is at minimum. Therefore, the four interfaces (two for each barrier) are expected to contribute most to linewidth broadening.

Figure 9:
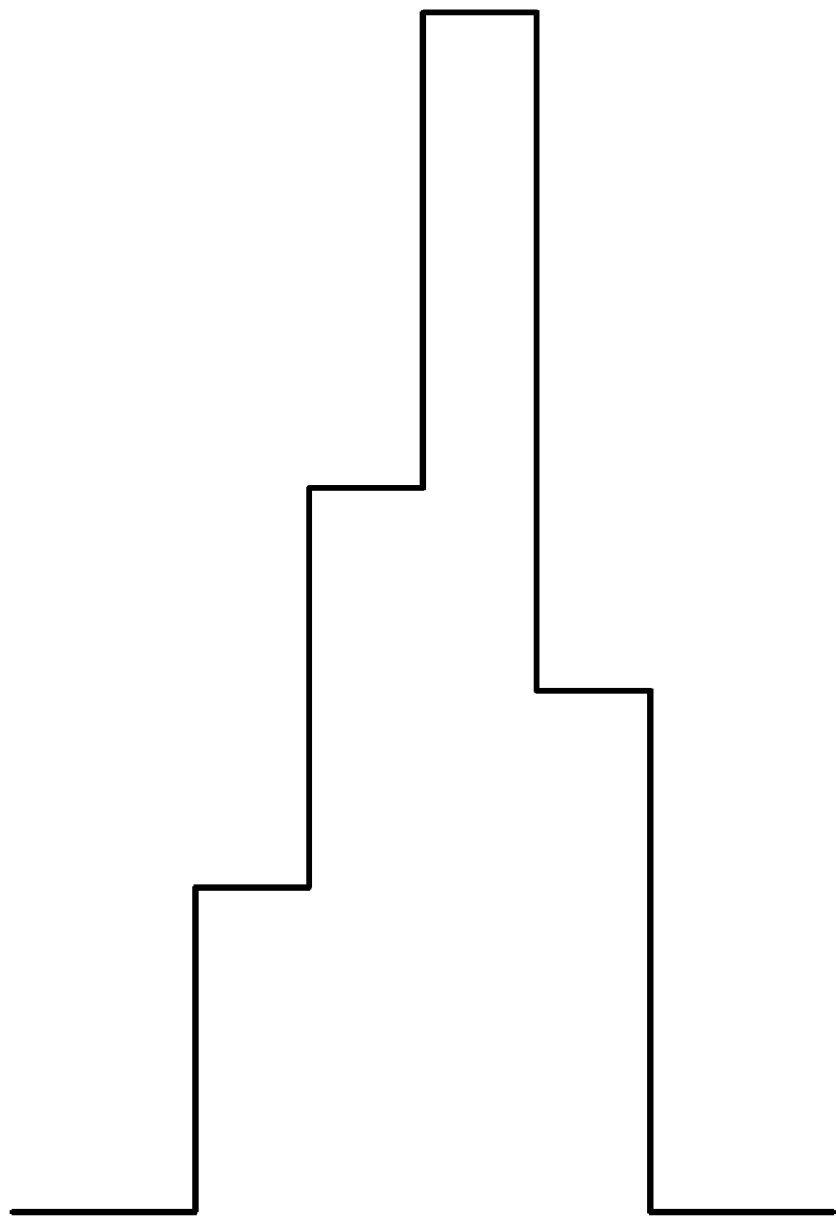
FIG. 9 is a schematic showing an example of interface grading for a thin active region barrier.

Formula 1 was derived assuming that thicknesses of the layers at hand are larger than length of interface roughness Δ. Typical thicknesses for the first and the second active region barriers are in the range of two to five monolayers (six to fifteen Angstroms). Depending on epi-growth quality, a barrier thickness of two to five monolayers is comparable to, or even less than, total roughness at both interfaces of a barrier 2Δ. In other words, the whole barrier thickness d may be irregularly graded as shown in FIG. 9. In this case, Formula 1 cannot be directly applied to calculate laser transition linewidth since it was derived assuming d>2Δ. In particular, Formula 1 cannot predict dependence of laser transition linewidth on thicknesses of the first and the second barriers. However, one may expect that since the whole thickness of the barrier may be graded, linewidth could be reduced employing thinner barriers since this reduces overlap between the laser levels wavefunctions and the graded barriers.

To demonstrate that narrow electroluminescence (EL) can be achieved for high strain QCL structures with the thin first and second active region barriers, we experimentally characterized the following three structures with laser emission at ~4.6 μm. For a base level performance we used the NRE structure shown in FIG. 8 that is based on $Al_{0.64}In_{0.36}As/In_{0.67}Ga_{0.33}As$ composition with strain of −1.1% in the AlInAs layers and strain of 1.0% in the InGaAs layers. Structures #2 and #3 are based on $Al_{0.78}In_{0.22}As/In_{0.72}Ga_{0.28}As$ (strain of −2.0% and 1.3%) and $Al_{0.85}In_{0.15}As/In_{0.75}Ga_{0.25}As$ (strain of −2.5% and 1.5%) compositions, respectively.

Each of the three structures is bias independent, designed using non resonant extraction principles and grown and processed under the same conditions. Band offsets, first and second active region barriers thicknesses, and measured EL FWHM (full width at half maximum) for the three structures are summarized in FIG. 11.

Laser transition increase due to higher band offset in Structures #2 and #3 was compensated by transition energy reduction due to narrower first and second active region barriers. As a consequence, the total nominal thickness of the first and the second active region barriers progressively reduces from 25 Angstroms for Structure #1 to 19 Angstroms for Structure #2 to 17 Angstroms for Structure #3.

The data in FIG. 11 show that EL FWHM reduces from 26 meV for Structure #1 down to 20 meV for Structure #3, despite ~50% increase in potential barrier height for Structure #3. This is consistent with the assumption that lower laser wavefunctions overlap with the barriers leads to narrower linewidth. FIG. 11 data also demonstrate that this effect can be stronger than linewidth broadening due to larger potential barriers. Therefore, in addition to a better design stability and suppressed carrier leakage, high strain QCL structures with ultra thin first and second active region barriers also offer advantage of narrow laser transition linewidth.

Figure 10:
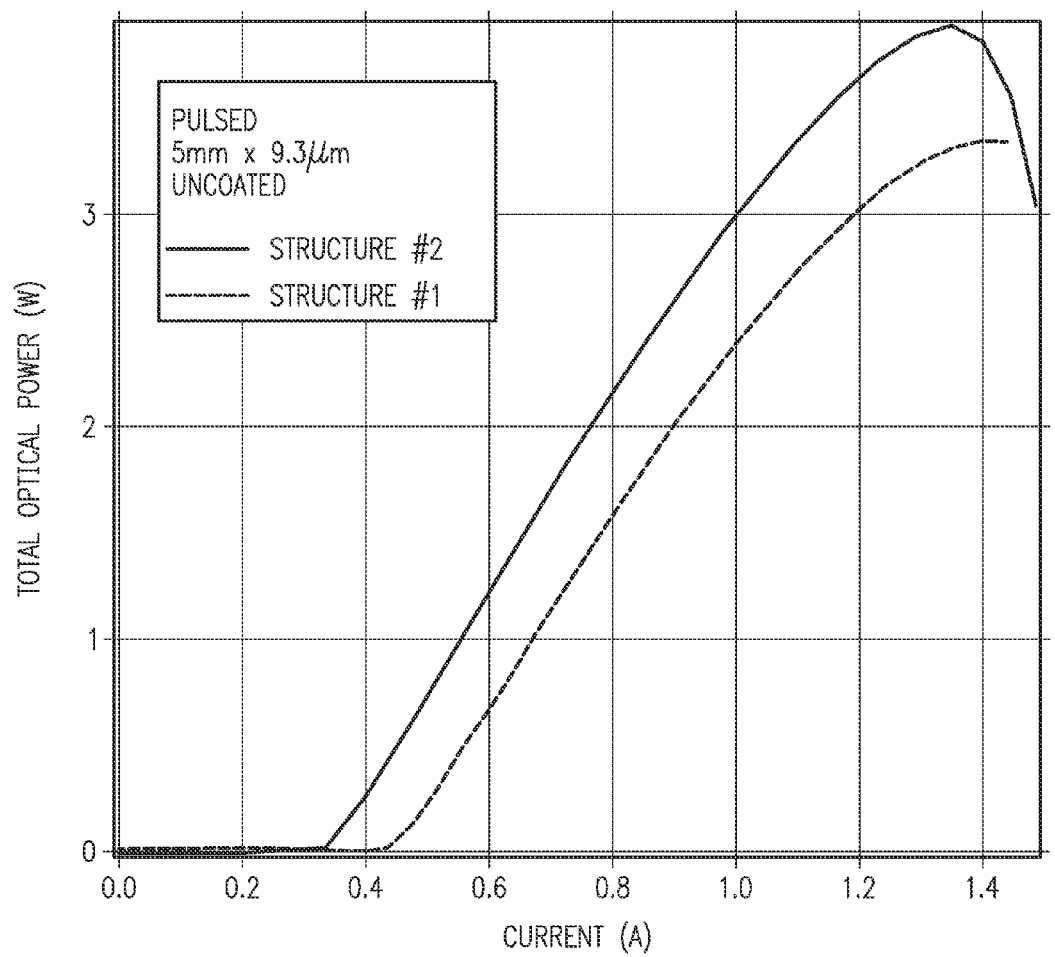
FIG. 10 is an optical power vs current characteristics for Structures #2 and #1 of FIG. 11.

Improvement in laser transition linewidth directly translates to improvement in laser characteristics. FIG. 10 compares light vs. current characteristics for QCLs with the same dimensions processed from Structure #2 (the upper line) and Structure #1 (the lower line). Threshold current density for Structure #2 is approximately 20% lower than that for Structure #1. These data are in accordance with the fact that structure #2 has ~20% narrower linewidth and that threshold current density is inversely proportional to linewidth.

In conclusion, we have presented QCL design methods that improve laser design stability with bias change, reduce laser transition electroluminescence, and improve laser temperature characteristics. QCLs based on a high strain composition with narrow first/second active region barriers and designed using bias independent design principles have superior performance compared to QCLs engineered using traditional design approaches.

While the present invention has been described with regards to particular embodiments, it is recognized that additional variations of the present invention may be devised without departing from the inventive concept.

REFERENCES

[1] J. Faist, D. Hofstetter, M. Beck, T. Aellen, M. Rochat, and S. Blaser, Bound-to-Continuum and Two-Phonon Resonance Quantum-Cascade Lasers for High Duty Cycle, High-Temperature Operation, IEEE Journal of Quantum Electronics 38, 533 (2002).
[2] J. Faist, Wallplug Efficiency of Quantum Cascade Lasers: Critical Parameters and Fundamental Limits, Applied Physics Letters 90, 253512 (2007).
[3] K. Fujita, S. Furuta, A. Sugiyama, T. Ochiai, T. Edamura, N. Akikusa, M. Yamanishi, and H. Kan, Room Temperature, Continuous-Wave Operation of Quantum Cascade Lasers With Single Phonon Resonance-Continuum Depopulation Structures Grown by Metal Organic Vapor-Phase Epitaxy, Applied Physics Letters 91, 141121 (2007).
[4] A. Wittmann, Y. Bonetti, J. Faist, E. Gini, and M. Giovannini, Intersubband Linewidths in Quantum Cascade Laser Designs, Applied Physics Letters 93, 141103 (2008).

INDUSTRIAL APPLICABILITY

This invention may be industrially applied to the development, manufacture, and use of quantum cascade lasers.

What is claimed is:

1. A quantum cascade laser comprising:
   (a) a semiconductor with only one type of carrier, the semiconductor having multiple layers of $Al_xIn_{1-x}As/In_yGa_{1-y}As$, where In is indium, Ga is gallium, As is arsenic, Al is aluminum, x is a number between (but not including) 0 and 1, and y is a number between (but not including) 0 and 1;
   (b) an electric current injected along an x-axis perpendicular to the multiple layers;
   (c) an insulator to confine the electric current under a contact stripe and to prevent the electric current from spreading in a y-axis parallel to the multiple layers;
   (d) a first active region barrier, the first active region barrier having a thickness of less than fourteen angstroms;
   (e) a second active region barrier, the second active region barrier having a thickness of less than eleven angstroms; and
   (f) a bias independent design with strong active region/injector coupling, the bias independent design characterized by:
      (i) an active region and multiple injector states,
      (ii) the active region including a lower active region state having a lower active region wavefunction,
      (iii) each of the multiple injector states having an injector level wavefunction,
      (iv) the lower active region wavefunction overlapping with each of the injector level wavefunctions,
      (v) a laser transition that is vertical at a bias close to roll-over,
      (vi) an injector level 3' being above a lower laser level 3,
      (vii) an injector level 2' being below the lower laser level 3,
      (viii) an active region level 2 being confined to the active region, (ix) the lower laser level 3 being separated from the active region level 2 by an energy of the longitudinal optical (LO) phonon, (x) the remaining active region states (that is, other than active region level 2) and the remaining injector states (that is, other than injector level 2' and injector level 3') being located either above the lower laser level 3 or significantly below the active region level 2, whereby the lower laser level 3 is well-confined in the active region in a broad bias range and a laser transition from a laser level 4 to the lower laser level 3 is vertical.

2. The quantum cascade laser of claim 1, where x is 0.78, y is 0.72, the semiconductor has a strain of −2.0% in the $Al_{0.78}In_{0.22}As$ layers and a strain of 1.3% in the $In_{0.72}Ga_{0.28}As$ layers, the thickness of the first active region barrier is eleven angstroms (11 A), and the thickness of the second active region barrier is eight angstroms (8 A).

3. The quantum cascade laser of claim 1, where x is 0.85, y is 0.75, the semiconductor has a strain of −2.5% in the $Al_{0.85}In_{0.15}As$ layers and a strain of 1.5% in the $In_{0.75}Ga_{0.25}As$ layers, the thickness of the first active region barrier is eleven angstroms (11 A), and the thickness of the second active region barrier is six angstroms (6 A).

4. A quantum cascade laser with a wavelength of less than 5 microns, the quantum cascade laser comprising:
(a) a semiconductor with only one type of carrier, the semiconductor having multiple layers of $Al_xIn_{1-x}As/In_yGa_{1-y}As$, where In is indium, Ga is gallium, As is arsenic, Al is aluminum, x is greater than 0.65, and y is greater than 0.67;

(b) an electric current injected along an x-axis perpendicular to the multiple layers;

(c) an insulator to confine the electric current under a contact stripe and to prevent the electric current from spreading in a y-axis parallel to the multiple layers;

(d) a first active region barrier, the first active region barrier having a thickness of less than eleven angstroms; and (e) a second active region barrier.

5. A quantum cascade laser with a wavelength of less than 5 microns, the quantum cascade laser comprising:
(a) a semiconductor with only one type of carrier, the semiconductor having multiple layers of $Al_xIn_{1-x}As/In_yGa_{1-y}As$, where In is indium, Ga is gallium, As is arsenic, Al is aluminum, x is greater than 0.65, and y is greater than 0.67;

(b) an electric current injected along an x-axis perpendicular to the multiple layers;

(c) an insulator to confine the electric current under a contact stripe and to prevent the electric current from spreading in a y-axis parallel to the multiple layers;

(d) a first active region barrier; and (e) a second active region barrier, the second active region barrier having a thickness of less than eleven angstroms.

6. The quantum cascade laser of claim 4, the second active region barrier having a thickness of less than eleven angstroms.

* * * * *